US011462753B2

(12) United States Patent
Munthe et al.

(10) Patent No.: US 11,462,753 B2
(45) Date of Patent: Oct. 4, 2022

(54) ELECTRICAL CONNECTOR FOR FUEL CELL STACK VOLTAGE MONITORING

(71) Applicant: POWERCELL SWEDEN AB, Gothenburg (SE)

(72) Inventors: Stefan Munthe, Västra Frölunda (SE); Mattias Holmberg, Gothenburg (SE)

(73) Assignee: POWERCELL SWEDEN AB, Gothenburg (SE)

( * ) Notice: Subject to any disclaimer, the term of this patent is extended or adjusted under 35 U.S.C. 154(b) by 402 days.

(21) Appl. No.: 16/623,451

(22) PCT Filed: Jun. 8, 2018

(86) PCT No.: PCT/SE2018/050598
§ 371 (c)(1),
(2) Date: Dec. 17, 2019

(87) PCT Pub. No.: WO2018/236266
PCT Pub. Date: Dec. 27, 2018

(65) Prior Publication Data
US 2020/0176792 A1 Jun. 4, 2020

(30) Foreign Application Priority Data
Jun. 20, 2017 (SE) .................................. 1750786-4

(51) Int. Cl.
*G01R 1/44* (2006.01)
*H01M 8/04537* (2016.01)
(Continued)

(52) U.S. Cl.
CPC .... *H01M 8/04552* (2013.01); *G01R 31/3835* (2019.01); *G01R 31/396* (2019.01);
(Continued)

(58) Field of Classification Search
CPC .. G01R 31/3835; G01R 31/396; G01R 1/073; G01R 19/16542; G01R 31/36;
(Continued)

(56) References Cited

U.S. PATENT DOCUMENTS 6,531,876 B1    3/2003  Einhart et al.
6,638,650 B1 *  10/2003  Bailey ............... H01M 8/04089
                                                 429/432

(Continued)

FOREIGN PATENT DOCUMENTS

JP    2005502996       1/2005
JP    2007522611 A     8/2007
(Continued)

OTHER PUBLICATIONS

Swedish Official Action (dated Jan. 19, 2018) for corresponding Swedish Application 1750786-4.
(Continued)

*Primary Examiner* — Vinh P Nguyen
(74) *Attorney, Agent, or Firm* — WRB-IP LLP

(57) ABSTRACT

An electric connector for fuel cell stack voltage monitoring includes at least two separate units, each unit including a plurality of pins, each pin being adapted to contact a plate of the fuel cell stack for monitoring a fuel cell stack voltage. The first pin of each unit is adapted to provide a measurement of a reference voltage.

10 Claims, 3 Drawing Sheets

(51) Int. Cl.
*G01R 31/396* (2019.01)
*G01R 31/3835* (2019.01)
*H01M 8/0258* (2016.01)
*H01R 31/00* (2006.01)

(52) U.S. Cl.
CPC ..... *H01M 8/0258* (2013.01); *H01M 8/04559* (2013.01); *H01R 31/005* (2013.01); *H01R 2201/20* (2013.01)

(58) Field of Classification Search
CPC ........... H01M 8/0258; H01M 8/04552; H01M 8/04559; H01M 16/006; H01M 8/04589; H01M 8/10; H01M 8/04119; H01M 8/249; H01M 8/24; H01M 8/0491; H01R 13/6683; H01R 2201/20; H01R 31/005; H01R 13/02; H01R 13/2414; H01R 4/04; Y02E 60/50; Y02E 60/10; H02J 2300/30; H02J 1/001; Y02T 90/40
See application file for complete search history.

(56) References Cited

U.S. PATENT DOCUMENTS

| | | | | |
|---|---|---|---|---|
| 6,749,452 B2 * | 6/2004 | Hortop | | H01M 8/04537 |
| | | | | 439/260 |
| 6,798,221 B2 * | 9/2004 | Wang | | H01M 8/04671 |
| | | | | 324/525 |
| 6,953,630 B2 * | 10/2005 | Wells | | H01M 16/006 |
| | | | | 429/432 |
| 7,344,792 B2 * | 3/2008 | Barton | | H01M 8/2465 |
| | | | | 429/465 |
| 7,361,065 B1 * | 4/2008 | Hardy | | H01R 13/516 |
| | | | | 439/856 |
| 8,865,365 B2 * | 10/2014 | Otake | | H01M 8/0202 |
| | | | | 429/468 |
| 9,039,462 B2 * | 5/2015 | Yoon | | H01M 8/04552 |
| | | | | 439/752 |
| 10,024,927 B2 * | 7/2018 | Katano | | G01R 31/364 |
| 2003/0054220 A1 | 3/2003 | Barton et al. | | |
| 2004/0150405 A1 | 8/2004 | Burany et al. | | |
| 2005/0215124 A1 | 9/2005 | Vale et al. | | |
| 2008/0208490 A1 | 8/2008 | Matsumoto et al. | | |
| 2009/0305086 A1 | 12/2009 | Lee et al. | | |
| 2013/0209911 A1 | 8/2013 | Otake et al. | | |
| 2013/0318560 A1 | 11/2013 | Yoon et al. | | |

FOREIGN PATENT DOCUMENTS

| | | |
|---|---|---|
| JP | 2010212024 | 9/2010 |
| WO | 2005069026 A1 | 7/2005 |

OTHER PUBLICATIONS

Indian Official Action (dated Dec. 16, 2020) for corresponding Indian App. 201927046365.
Japanese Official Action (dated Dec. 24, 2020) far corresponding Japanese App. 2019-570499.
Korean Official Action (dated Mar. 2, 2021) for corresponding Korean App. 10-2019-7037352.
International Search Report (dated Aug. 20, 2018) for corresponding International App. PCT/SE2018/050598.

* cited by examiner

Fig. 2

ELECTRICAL CONNECTOR FOR FUEL CELL STACK VOLTAGE MONITORING

BACKGROUND AND SUMMARY

The present invention relates to an electric connector for fuel cell stack voltage monitoring. Further, the present invention relates to an electric connector arrangement comprising at least two of these electric connectors. Moreover, the present invention relates to a fuel cell stack arrangement comprising such an electric connector. Furthermore, the present invention relates to a method for fuel cell stack voltage monitoring.

A fuel cell stack is usually formed by stacking a large number of unit cells into numerous layers. Each of the unit cells comprises at least a membrane electrode assembly (MEA) having an ion exchange membrane sandwiched between an anode and a cathode, and fluid flow field plates on both outer sides of the MEA. Through the fluid flow field plates, hydrogen fuel and an oxidizing agent are supplied to the MEA, which generates electric power.

For such a fuel cell stack, management of the power generation state of each unit cell is necessary in order to control the amounts of supplied hydrogen and oxygen and/or to find a broken or malfunctioning unit fuel cell. To enable such management, the generated voltage for each unit cell is monitored and the control is carried out based on the monitored voltage.

For monitoring the fuel cell stack voltage, fluid flow field plates are connected by electrical connectors, which are adapted to electrically contact the fluid flow field plates.

From the state of the art, e.g. US 2003/054220 a comb-shaped electric contact element is known, which is supported on a support structure and whose teeth are adapted to abut to the bipolar plates, whereby the electric contact is established. The disadvantage of such a connector is manifold. Firstly, the used bipolar plates must have a certain minimum thickness for allowing an electrical contact to be established by adjoining bipolar plate and electric contact element. Secondly, the electric connector easily detaches from the bipolar plates, so that additional fixing elements are required for fixing the electric connector to the fuel cell stack. A further problem is that the distances between the teeth of the electric contact must be carefully designed in order to fit to the fuel cell stack. Thereby, only minimal manufacturing tolerances are allowed, which in turn results in a costly and time-consuming manufacturing process.

Further, for monitoring the voltages of a fuel cell stack, each plate needs to be contacted as the voltage of one plate is measured in comparison with the voltage of the previous plate. Thus, plates may not be easily skipped. In case a plate is skipped (which may be realized by using two or more electric connectors, wherein only one plate may be skipped) or if two electric connectors are used without skipping plates, the second electric connector has to be coupled via a jumper to the first electric connector so that the reference to the previous plate remains established. If more than one plate is skipped, the voltage is measured over more plates. However, this causes a wrong measurement as a correct voltage may be measured only with reference to the previous plate.

It is therefore desirable to provide an electric connector, which can be easily fixed to the fuel cell stack and allows for a flexible monitoring of the fuel cell stack voltage.

In die following, an electric connector is disclosed. The electric connector comprises at least two separate units, each unit comprising a plurality of pins, each pin being adapted to contact a plate of the fuel cell stack for monitoring a fuel cell stack voltage. The first pin of each unit is adapted to provide a measurement of a reference voltage.

Each unit of the electric connector comprises a plurality of pins (also called contact pins), wherein one of these pins is used for providing a reference voltage. This means that each pin except of the first pin may measure a voltage with respect to the reference voltage provided by the first pin of each unit. Accordingly, it is therefore possible to skip as many cells or plates as desired as each unit provides its own reference voltage and the reference voltage may thus be provided not only at the first plate of a fuel cell stack but also at any other plate which is contacted by the first pin. This provides a very variable usage of the electric connector as also more than one plate may be skipped.

If the first pin of the second unit and the last pin of the first unit contact the same plate, each pin of the second unit, except of the first pin, may measure a voltage with respect to the reference voltage provided by the first pin of the first unit. This means that in this case each pin of each unit except of the first pin of the first unit and the first pin of the second unit may measure a voltage with respect to the reference voltage provided by the first pin of the first unit without the need for using jumpers.

The variable usage of the electric connector may be further enhanced when each unit comprises an adjustable number of pins. In such an embodiment, the number of pins may be adapted to the number of plates. Each unit may comprise a different number of pins.

According to an embodiment, each unit is adapted to be attached to the fuel cell stack using a friction fit connection. This means that the pins are inserted into the fuel cell stack and the electric connector can be hold in the fuel cell stack by friction between the pins and the plates. Additional holding means are not necessary.

According to a further embodiment, the electric connector comprises a plug which is connected to the at least two units and which is adapted to connect the electric connector with a cell voltage measurement system. The plug may be any kind of standard plug which is suitable to be connected to a cell voltage measurement system on the one side and the units of the electric connector on the other side. In this embodiment, the at least two units are connected to the same plug.

In another embodiment, the electric connector comprises at least two plugs, each plug being connected to one of the at least two units. This means that each plug is connected to one of the units on the one side and to the cell voltage measurement system on the other side.

According to a further embodiment, each unit and/or plug is provided on a rigid holding element, such as a plastic plate or a printed wire board. This means that the pins of each unit are attached to a rigid holding element. The length of each unit, and thus also the number of pins, may be adjusted by cutting the rigid holding element into length. The overall assembly of electric connector and printed circuit board may thus be insensitive to fine tolerances. Further, the printed wire board may support heat expansion.

As the first pin of each unit may be defined and thus it may be determined which pin provides a reference voltage, it is even possible to separate one unit into two or more sub-units by cutting the rigid holding element into two or more parts. This may allow a finer resolution to a possible total cell number. If this is the case, the first pin of each sub-unit may be determined for providing a reference voltage.

According to a further embodiment, the plug and the at least two units are connected via conductive paths bonded into a flexible plastic material. As a flexible plastic material is used, a variable positioning of the units and the plug with respect to each other may be achieved as the connection may be easily bent.

Further, when the units are cut and separated into several sub-units, the flexible plastic material may also be cut into several connections so that the conductive paths of leading to one sub-unit are separated from the conductive paths leading to another sub-unit. Due to the flexible plastic material, it may be possible to switch the location of contact pins to facilitate a variety of stack sizes.

The plug may be adapted to provide an analog signal, i.e. a signal from the contact pins, to the cell voltage measurement system. In the cell voltage measurement system, the analog signal may be analyzed and a result of the analyzation may be provided as a digital signal to any further processing or computing unit. The analog signal as provided via the plugs may be transmitted via a bus or the like to the cell voltage measurement system. Thus, the analyzation and further processing, which is carried out in the cell voltage measurement system may be located remote. This provides the advantage that no space for the cell voltage measurement is required in the fuel cell stack. Further, the heat generation may be reduced at the fuel cell stack.

According to a further embodiment, the plug is attachable to a holding element of the fuel cell stack, in particular to a housing element of the fuel cell stack, using attaching elements providing a variable positioning of the plug. The attaching elements may be screws and or clips. The housing may be for example a touch protection of the fuel cell stack or a holder of the touch protection. The touch protection may be an extruded plastic profile or profiled holding board. The material used for the housing may be made of a plastic material, in particular reinforced plastics such as fiber-reinforced plastic.

The attaching elements may provide a variable positioning of the plug as they may be attached to the holding element at variable positions. This may be realized for example using self-tapping screws which can be attached to the housing without a need for holes.

According to a further embodiment, the pins of one unit are arranged in at least two rows. This means that two consecutive pins are arranged in two different rows and are thus offset to each other. This may provide the advantage that the cells may be designed very thin. As the pins are offset to each other, they may contact the cells without contacting each other. Thus, short circuiting may be avoided.

Preferably, the pins of one unit are arranged in three rows. Therefore, three consecutive pins are arranged in three different rows and are thus offset to each other. This allows for even thinner plates.

According to a further embodiment, at least the first unit comprises a protrusion on which the first pin is arranged and wherein at least the second unit comprises a recess being correspondingly formed opposed to the protrusion so that the protrusion of the first unit and the recess of the second unit fit to each other. With this specific arrangement, a dual connection to one cell by two electric connectors is made possible because the first pin of the first unit of one electric connector can contact the same plate as the last pin of the second unit of a second electric connector as described above. This may also be referred to as dual connection capability. Thus, the reference voltage is provided by the first pin of the first unit and all other pins measure the voltage in reference to the voltage of the very first plate contacted by the electric connector.

According to a further aspect, an electric connector arrangement is suggested which comprises at least two electric connectors as described above.

In such an electric connector arrangement, each connector may be connectable via one plug with a cell voltage measurement system. Thus, the at least two units of the electric connector are connected with one plug.

If each unit of one electric connector is connected via one plug with a cell voltage measurement system, the respective electric connector may be connected to the cell voltage measurement system using several plugs.

Also a combination of these arrangements may be used. For example, one plug may be connected to two or more units and a further plug may be connected to a single unit only.

According to a further aspect, a fuel cell stack arrangement is suggested which comprises a fuel cell stack with at least two fuel cell units comprising a fluid flow field plate, in particular a bipolar plate, and a membrane electrode assembly, and at least one electric connector as described above. In an assembled state, the pins of the at least two units are arranged to contact the fluid flow field plates of the at least two fuel cell units for monitoring a fuel cell stack voltage.

According to a further aspect, a method for fuel cell stack voltage monitoring is suggested which comprises the following steps: arranging an electric connector as described above to a fuel cell stack by contacting the pins of the at least two units to the fluid flow field plates of the fuel cell stack, wherein the pins of one of units connect subsequently arranged fluid flow field plates, and using the first pin of each unit for determining a reference voltage for voltage monitoring of the fluid flow field plates connected by the units.

Further advantages and preferred embodiments are disclosed in the claims, the description and the figures. It should be further noted that a person skilled in the art may combine the presented features otherwise than indicated without extending the scope of the invention.

BRIEF DESCRIPTION OF THE DRAWINGS

In the following, the present invention will be described by means of embodiments shown in the figures. The shown embodiments are exemplarily, only, and are not intended to limit the scope of protection. The scope of protection is solely defined by the attached claims.

The figures show:
FIG. 2: a second schematic view of a fuel cell stack with two electric connectors.

DETAILED DESCRIPTION

Figure 1:
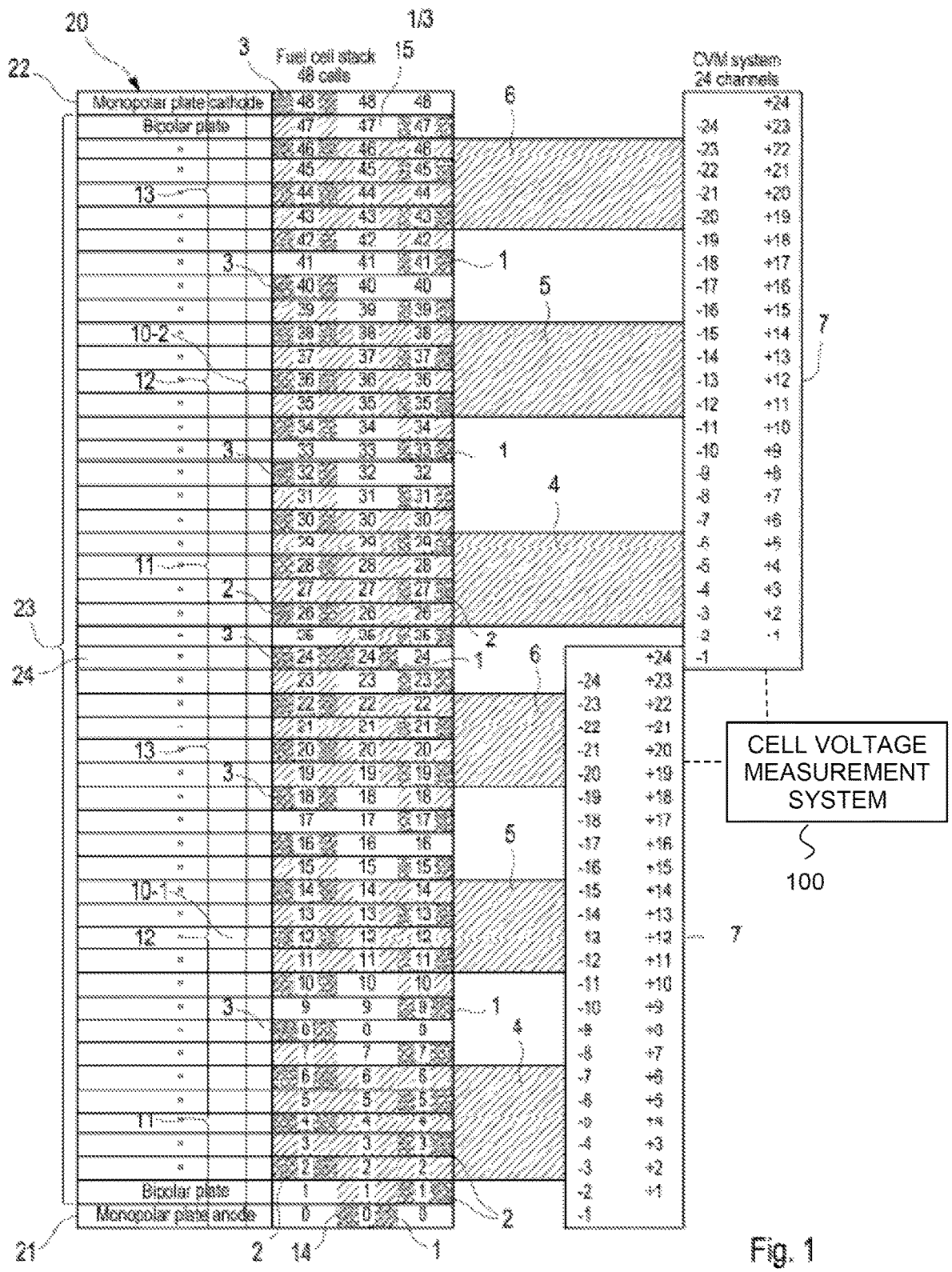
FIG. 1: a first schematic view of a fuel cell stack with two electric connectors.

In the following same and similar functioning elements are indicated with the same reference numerals.

Figure 2:
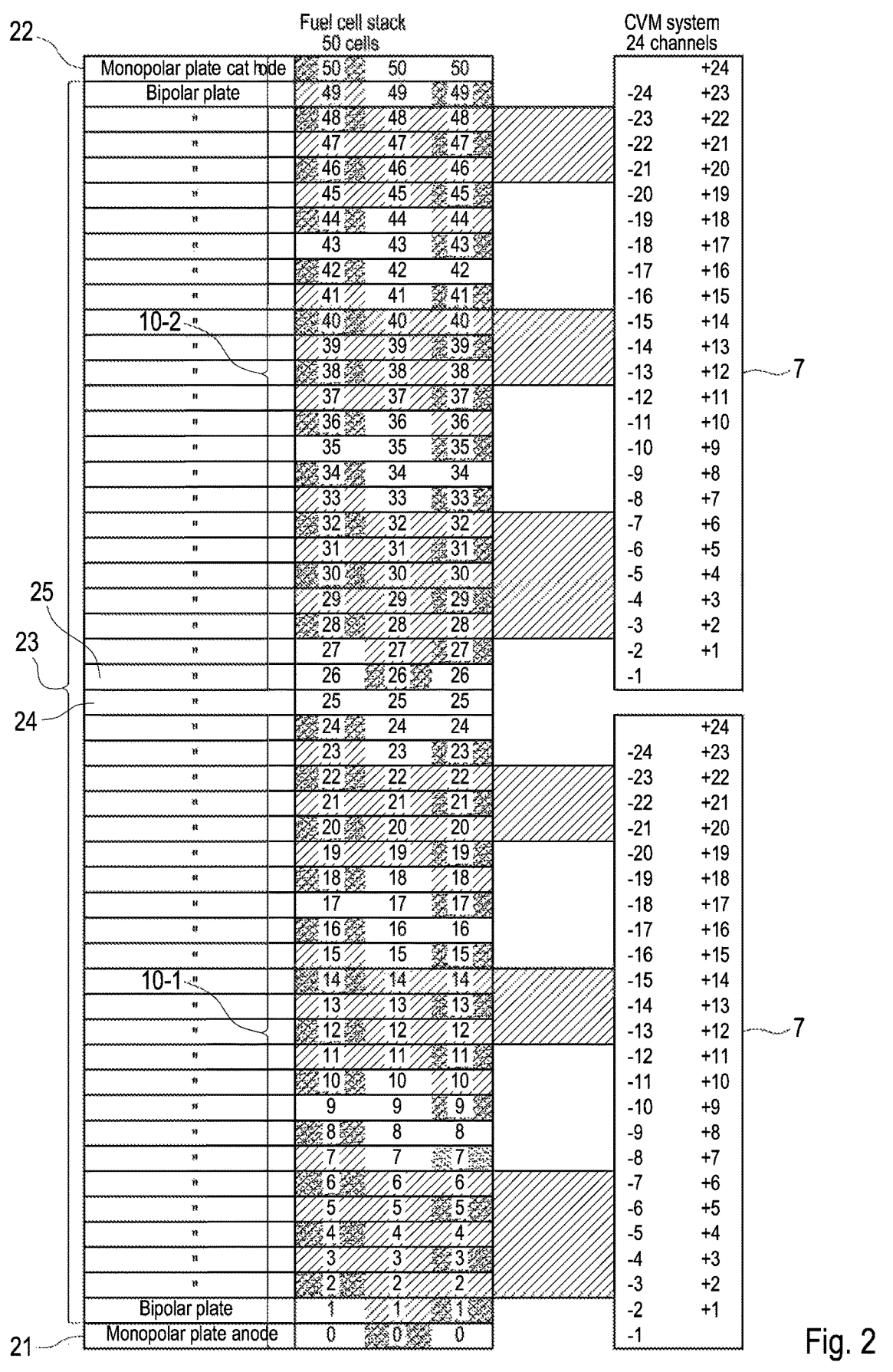

FIGS. 1 and 2 show two schematic views of a fuel cell stack 20 with two electric connectors 10 (10-1, 10-2). The fuel cell stack 20 comprises a plurality of bipolar plates 23, sandwiched between two monopolar plates 21 (anode) and 22 (cathode). The plates 21, 22, 23 are also referred to as fluid flow field plates.

For electrically contacting the plates 21, 22, 23 of the fuel cell stack 20, an electric connector 10 is provided. In the embodiments illustrated in FIGS. 1 and 2, each electric connector 10-1, 10-2 contacts 25 plates. However, any other number of plates may be possible.

Each electric connector 10-1, 10-2 comprises three units 11, 12, 13. Each unit 11, 12, 13 comprises a plurality of contact pins 1, 2, 3 which contact the plates 21, 22, 23. Each unit 11, 12, 13 is connected via conductive paths 4, 5, 6 to a plug 7.

A first pin 1 of each of the units 11, 12, 13 is adapted to provide a reference voltage. In FIG. 1, as the units 11, 12, 13 are arranged without skipping any plates, and the two electric connectors 10 are arranged without skipping any plates, the voltages of the fuel cell stack being monitored by the pins 1, 2 and 3 of the units 11, 12, 13, except of the first pin 1 of the first unit 11 of the lower electric connector 10-1, can be monitored with respect to the reference voltage being provided by the first pin 1 of the first electric connector 10-1, i.e. with reference to the monopolar plate 21. As the first pin 1 of the upper electric connector 10-2 and the last pin 3 of the lower electric connector 10-1 are connected to the same plate 24, this connection functions as a kind of jumper.

This is facilitated as the first unit 11 of each electric connector 10 comprises a protrusion 14 on which the first pin 1 is arranged. The third unit 13 comprises a recess 15 being correspondingly formed opposed to the protrusion 14. The protrusion 14 and the recess 15 are corresponding. This is also shown in FIGS. 4 to 7.

This arrangement provides the advantage that the first pin 1 of the first unit 11 of the upper electric connector 10-2 may contact an anode of a plate 24 of the fuel cell stack 20 and that the last pin 3 of the third unit 13 of the lower electric connector 10-1 may contact a cathode of the same fluid flow field plate 24 of the fuel cell stack 20 as shown in FIG. 1. As explained above, the voltages of each plate 22, 23, 24 are measured with reference to the voltage of the monopolar plate 21 provided by the first pin 1 of the first unit 11 of the lower electric connector 10-1.

In FIG. 2, one plate 24 is skipped between the electric connectors 10. In this case, the voltages of the fuel cell stack being monitored by the pins 1, 2 and 3 of the units 11, 12, 13 of the lower electric connector 10-1, except of the first pin 1 of the first unit 11 of the lower electric connector 10-1, can be monitored with respect to the reference voltage being provided by the first pin 1 of the first electric connector 10-1. i.e. with reference to tire monopolar plate 21. The voltages of the fuel cell stack being monitored by the pins 1, 2 and 3 of the units 11, 12, 13 of the upper electric connector 10-2, except of the first pin 1 of the first unit 11 of the upper electric connector 10-2, can be monitored with respect to the reference voltage being provided by the first pin 1 of the first unit 11 of the upper electric connector 10-2, i.e. with reference to the plate 25. Thus, fluid flow field plates may be skipped between the electric connectors 10.

As can be seen in FIGS. 1 and 2, the contact pins 1, 2, 3 are arranged in three rows and are thus displaced or offset to each other. This provides the advantage that they may contact the plates 21, 22, 23 without contacting each other. Thus, short circuiting may be avoided. However, any other number of rows is possible.

Although each electric connector 10 is shown having three units 11, 12, 13, any other number of units may be used. Further, the electric connector 10 may each have a different number of units and/or a different number of contact pins.

In the embodiments as shown in FIGS. 1 and 2, the electric connectors 10 are each connected to a plug 7 which may be coupled to a cell voltage measurement system 100.

It is also possible to connect each unit 11, 12, 13 with one separate plug 7. Also a combination of this arrangement of units and plugs is possible.

The contact pins 1, 2, 3 and the plugs 7 may be connected via conductive paths being bonded into a flexible plastic material. This is shown in more detail with reference to FIGS. 3 to 7.

Figure 3:
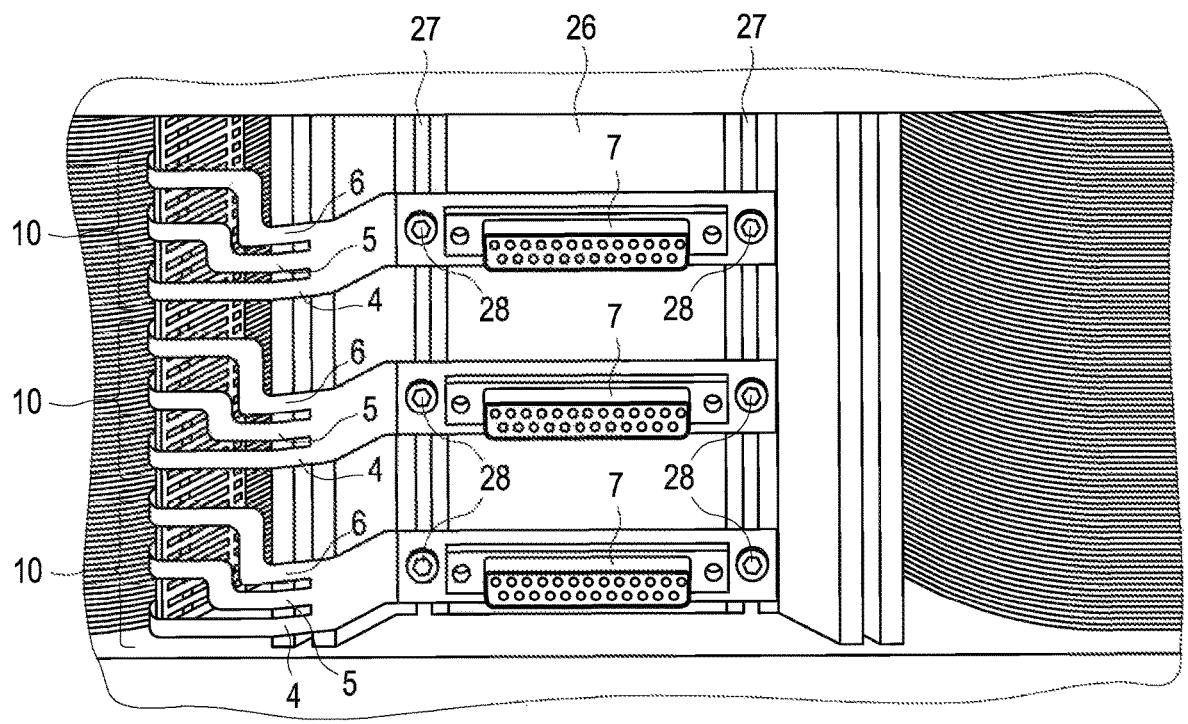
FIG. 3: a perspective view of a fuel cell stack with three electric connectors.

FIG. 3 shows a perspective view of the fuel cell stack 20 of FIGS. 1 and 2.

As can be seen, the contact pins 1, 2, 3 of the electric connectors 10 are provided on a printed wire board. The plugs 7 may also be provided on a printed wire board and are connected to the contact pins 1, 2, 3 via conductive paths being bonded into a flexible plastic material, for example the same material as a protective layer of the printed wire board.

The plugs 7 are attached to a housing 26 of fuel cell stack 20. The housing 26 may be a touch protection of the fuel cell stack. In the embodiment shown in FIG. 3, the housing 26 comprises slots 27. In a preferred embodiment, the plugs 7 are mounted to the housing 26 by self-tapping screws 28 which engage with the slots 27. This provides a variable way of attaching the plugs 7 to the fuel cell stack 20 as no pre-fabricated holes are needed in the housing 26.

As the contact pins 1, 2, 3 of the electric connectors 10 are arranged on a rigid board, e.g. a printed wire board (PWB), an easy attachment of the electric connectors 10 to the fuel cell stack 20 is enabled. No additional holding elements are needed as they electric connectors 10 are hold in the fuel cell stack 20 by friction between the contact pins 1, 2, 3 and the plates 21, 22, 23, 24, 25.

Further, as the contact pins are provided on a printed wire board, the units 11, 12, 13 may be grouped variable which is shown in FIGS. 4 to 7. This provides an electric connector 10 being adjustable to several fuel cell stack requirements.

In particular the combination of the adjustable number of pins 1, 2, 3 and the variable attachment of the plugs 7 enables an improved adaption of the electric connectors 10 to fuel cell stack requirements. In particular, a fine tuning of the electric connectors 10 to the dimension, e.g. the number of plates, of the fuel cell stack 20 is provided.

Figure 4:
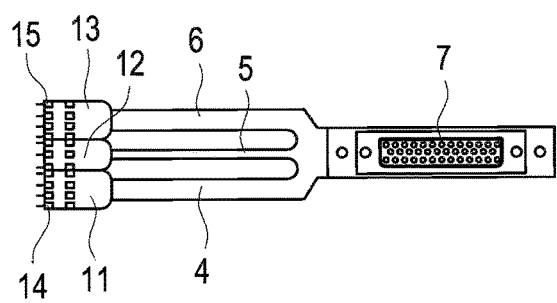
FIGS. 4 to 7: four examples of an electric connector.
Figure 5:
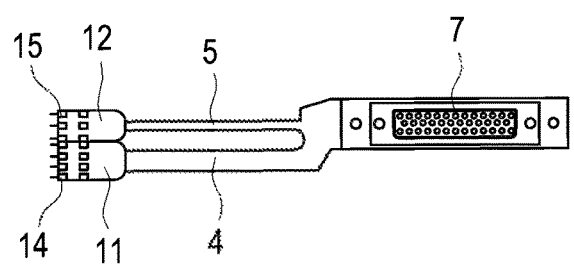

The electric connector 10 of FIG. 4 comprises three units 11, 12, 13, each of which is connected to the plug 7 via conductive paths 4, 5, 6.

In the embodiment of FIGS. 4 to 7, each unit 11, 12, 13 comprises a protrusion 14 and a corresponding recess 15. Thus, the units 11, 12, 13 may be arranged adjacent to each other wherein the protrusion 14 of unit 12 engages into the recess 15 of unit 11 and the protrusion 14 of unit 13 engages into the recess 15 of unit 12.

If less contact pins are required, some of the contact pins, preferably one unit, may easily be cut away. This is done in FIG. 5, where the third unit 13 is cut away together with the corresponding conductive paths 6. Thus, the electric connector 10 only comprises two units 11, 12 with less contact pins than in FIG. 4.

As explained above, each unit 11, 12, 13 has its own reference voltage provided via the first pin 1. If the first pin 1 one of unit 11, 12, 13 is cut away due to an adjustment to a fuel cell stack requirement (for example a size of the fuel cell stack 20), another pin, which now represents the first pin, provides the reference voltage.

Figure 6:
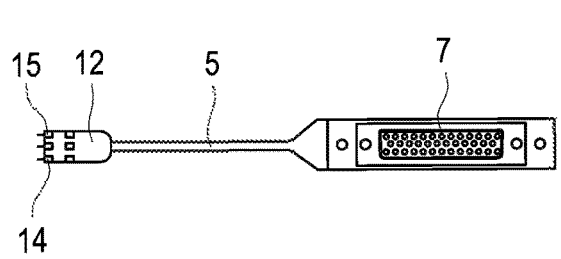

This may be repeated with the first unit 11 as shown in FIG. 6.

Figure 7:
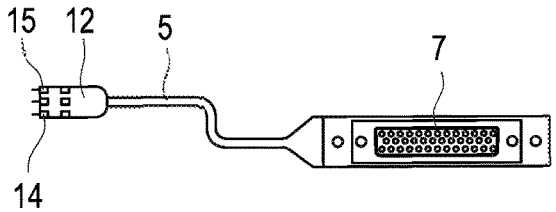

Due to the flexible conductive paths 4, 5, 6, the plugs 7 and the contact pins 1, 2, 3 may be arranged in an offset manner as shown in FIG. 7. Thus, the space being provided on the fuel cell stack 20 and the housing 26 may be optimally utilized.

The specific arrangement of the electric connector 10 as described above provides a variable and easy way of contacting plates within a fuel cell stack and an improved way of monitoring fuel cell stack voltages.

As the plurality of contact pins may be provided on a printed wire board, contacting of the plates may be done in a very variable manner. One or more contact pins of one unit may be cut away to enable a finer resolution of a possible total plate numbers. The overall assembly may thus be insensitive to fine tolerances. Further, the printed wire board may support heat expansion. In addition, it may be possible to switch the location of contact pins to facilitate unlimited variety of stack sizes.

REFERENCE SIGNS 1 first pin
2 contact pin
3 last pin
4, 5, 6 conductive paths
7 plug
10 electric connector
11, 12, 13 unit
14 protrusion
15 recess
20 fuel cell stack
21, 22 monopolar plate
23 bipolar plate
24 plate
25 plate
26 housing
27 slots
28 screw

The invention claimed is:

1. An electric connector for fuel cell stack voltage monitoring for a fuel stack comprising fluid flow field plates, comprising
at least two separate units, each unit comprising a plurality of pins, each pin being adapted to contact a fluid flow field plate of the fuel cell stack for monitoring a fuel cell stack voltage, and
at least two plugs, each plug being connected to one of the at least two units and being adapted to connect the electric connector with a cell voltage measurement system,
wherein a first pin of each unit is adapted to provide a measurement of a reference voltage of each unit for voltage monitoring of fluid flow field plates connected by the units.

2. The electric connector according to claim 1, wherein each unit is attachable to the fuel cell stack using a friction fit connection.

3. The electric connector according to claim 1, wherein each unit and/or the plugs are provided on a rigid holding element.

4. The electric connector according to claim 1, wherein the plugs and the at least two units are connected via conductive paths bonded into a flexible plastic material.

5. The electric connector according to claim 1, wherein the plugs are attachable to a holding element of the fuel cell stack, using attaching elements providing a variable positioning of the plugs.

6. The electric connector according to claim 1, wherein the pins of one unit of the at least two units are arranged in at least two rows.

7. The electric connector according to claim 1, wherein at least a first unit of the at least two units comprises a protrusion on which the first pin of the first unit is arranged and wherein at least a second unit of the at least two units comprises a recess being correspondingly formed opposed to the protrusion, wherein the protrusion of the first unit and the recess of the second unit are corresponding.

8. An electric connector arrangement comprising at least two electric connectors according to claim 1.

9. A fuel cell stack arrangement comprising
a fuel cell stack with at least two fuel cell units comprising a fluid flow field plate, and a membrane electrode assembly, and
at least one electric connector for fuel cell stack voltage monitoring for the fuel stack, the electric connector comprising
at least two separate units, each unit comprising a plurality of pins, each pin being adapted to contact a fluid flow field plate of the fuel cell stack for monitoring a fuel cell stack voltage, and
at least two plugs, each plug being connected to one of the at least two units and being adapted to connect the electric connector with a cell voltage measurement system,
wherein a first pin of each unit is adapted to provide a measurement of a reference voltage of each unit for voltage monitoring of fluid flow field plates connected by the units,
wherein, in an assembled state, the pins of the at least two units are arranged to contact the fluid flow field plates of the at least two fuel cell units for monitoring a fuel cell stack voltage.

10. A method for fuel cell stack voltage monitoring, comprising
arranging an electric connector for fuel cell stack voltage monitoring to a fuel cell stack, the fuel cell stack having at least two fuel cell units comprising a fluid flow field plate, and a membrane electrode assembly, the electric connector comprising at least two separate units, each unit comprising a plurality of pins, each pin being adapted to contact a fluid flow field plate of the fuel cell stack for monitoring a fuel cell stack voltage, and at least two plugs, each plug being connected to one of the at least two units and being adapted to connect the electric connector with a cell voltage measurement system, wherein a first pin of each unit is adapted to provide a measurement of a reference voltage of each unit for voltage monitoring of fluid flow field plates connected by the units, by contacting the pins of the at least two units to the fluid flow field plates of the fuel cell stack, wherein the pins of one of the units connects subsequently arranged fluid flow field plates, and
using the first pin of the units for determining the reference voltage for voltage monitoring of the fluid flow field plates connected by the units.

* * * * *